United States Patent [19]
Awaya et al.

[11] Patent Number: 5,576,996
[45] Date of Patent: Nov. 19, 1996

[54] SEMICONDUCTOR MEMORY DEVICE HAVING A VARIABLY WRITE PULSE WIDTH CAPABILITY

[75] Inventors: Tomoharu Awaya; Masaya Sugimoto, both of Kawasaki, Japan

[73] Assignee: Fujitsu Limited, Kawasaki, Japan

[21] Appl. No.: 454,862

[22] Filed: May 31, 1995

[30] Foreign Application Priority Data

Sep. 12, 1994 [JP] Japan .................................. 6-217243

[51] Int. Cl.$^6$ .......................... G11C 7/00; H03M 13/00
[52] U.S. Cl. ................. 365/189.01; 365/189.12; 365/194; 365/201; 371/6
[58] Field of Search ..................... 365/189.01, 189.12, 365/194, 230.03, 201; 327/172, 176, 291, 293; 371/6

[56] References Cited

U.S. PATENT DOCUMENTS

| | | | |
|---|---|---|---|
| 4,797,585 | 1/1989 | Segawa et al. | 327/176 |
| 5,014,245 | 5/1991 | Muroka et al. | 365/194 |
| 5,027,323 | 6/1991 | Miyamoto et al. | 365/194 |
| 5,144,525 | 9/1992 | Saxe et al. | 365/194 |
| 5,367,490 | 11/1994 | Akimoto et al. | 365/194 |

*Primary Examiner*—David C. Nelms
*Assistant Examiner*—Trong Phan
*Attorney, Agent, or Firm*—Armstrong, Westerman, Hattori, McLeland & Naughton

[57] ABSTRACT

A semiconductor memory device including a write control system for controlling data write to a selected memory cell on the basis of a write control signal, an external terminal for test, a write pulse generating circuit for generating a test write pulse on the basis of a set signal given from the external terminal and the write control signal, and supplying it to the write control system. The write pulse generating circuit includes a pulse-width changing circuit for variably setting a pulse width of the test write pulse on the basis of the set signal. The test write pulse width can be freely and precisely set by using the minimum possible number of external terminals for test. A test write pulse width which agrees with the real capacity of high speed devices can be obtained even by using relatively economical, low speed testing equipment.

5 Claims, 6 Drawing Sheets

SEMICONDUCTOR MEMORY DEVICE HAVING A VARIABLY WRITE PULSE WIDTH CAPABILITY

BACKGROUND OF THE INVENTION

1. Field of the Invention

This invention relates to a semiconductor memory device. More particularly, it relates to a semiconductor memory device adapted to testing and evaluation on the basis of a measurement of a write pulse width.

2. Description of the Related Art

The operating speed of semiconductor memory devices has been improved in recent years, and some of them operate at a pulse width of about 1 to 2 ns. On the other hand, testing equipment capable of generating such a high speed pulse is extremely expensive. Therefore, the evaluation of the circuits and their shipment and guarantee is expensive and the measurement of the write pulse width becomes difficult.

To avoid such problems, a write pulse generating circuit has been built into a semiconductor memory device (chip).

An example of such known methods fixes, hardware-wise, the write pulse width generated by the write pulse generating circuit at the time of production of the semiconductor memory device.

According to this system, however, the write pulse width cannot be changed and set after the production of the semiconductor memory device. For this reason, a simple judgement as to whether or not the product operates normally with the set write pulse width can be made, but the minimum pulse width that can be written cannot be measured. In other words, if data write cannot be made with the set write pulse width (that is, if the product does not operate normally), it is not at all possible to estimate how data write can be made possible by changing the pulse width or to what extent.

Another prior art method provides a large number of test terminals, and appropriately applies, from outside, a control signal to these terminals, and controls the built-in write pulse generating circuit so as to change the write pulse width.

In this system, however, there is a limit to the number of terminals on the semiconductor chip as a whole (that is, the number of external pins); hence, the number of terminals that can be used exclusively for testing is limited and it is difficult to accurately set the write pulse width. In other words, the adjustment can be made only roughly.

SUMMARY OF THE INVENTION

It is an object of the present invention to provide a semiconductor memory device which can freely and accurately set a test write pulse width by using a minimum number of external terminals exclusively for testing, and can obtain a test write pulse width which agrees with the real capacity of a high speed device even when relatively economical and low speed test equipment is used.

According to the present invention, there is provided a semiconductor memory device equipped with a write control system, for controlling date write to a selected memory cell on the basis of a write control signal, which comprises an external terminal for testing and a write pulse generating circuit for generating a test write pulse on the basis of a set signal and a write control signal applied thereto from the external terminal, and for supplying the test write pulse to the control system, wherein the write pulse generating circuit includes a variable pulse width circuit for variably setting the pulse width of the test write pulse on the basis of the set signal.

BRIEF DESCRIPTION OF THE DRAWINGS

The above and other objects and features of the present invention will be described hereinafter in detail by way of preferred embodiments with reference to the accompanying drawings, in which.

DESCRIPTION OF THE PREFERRED EMBODIMENTS

Figure 1:
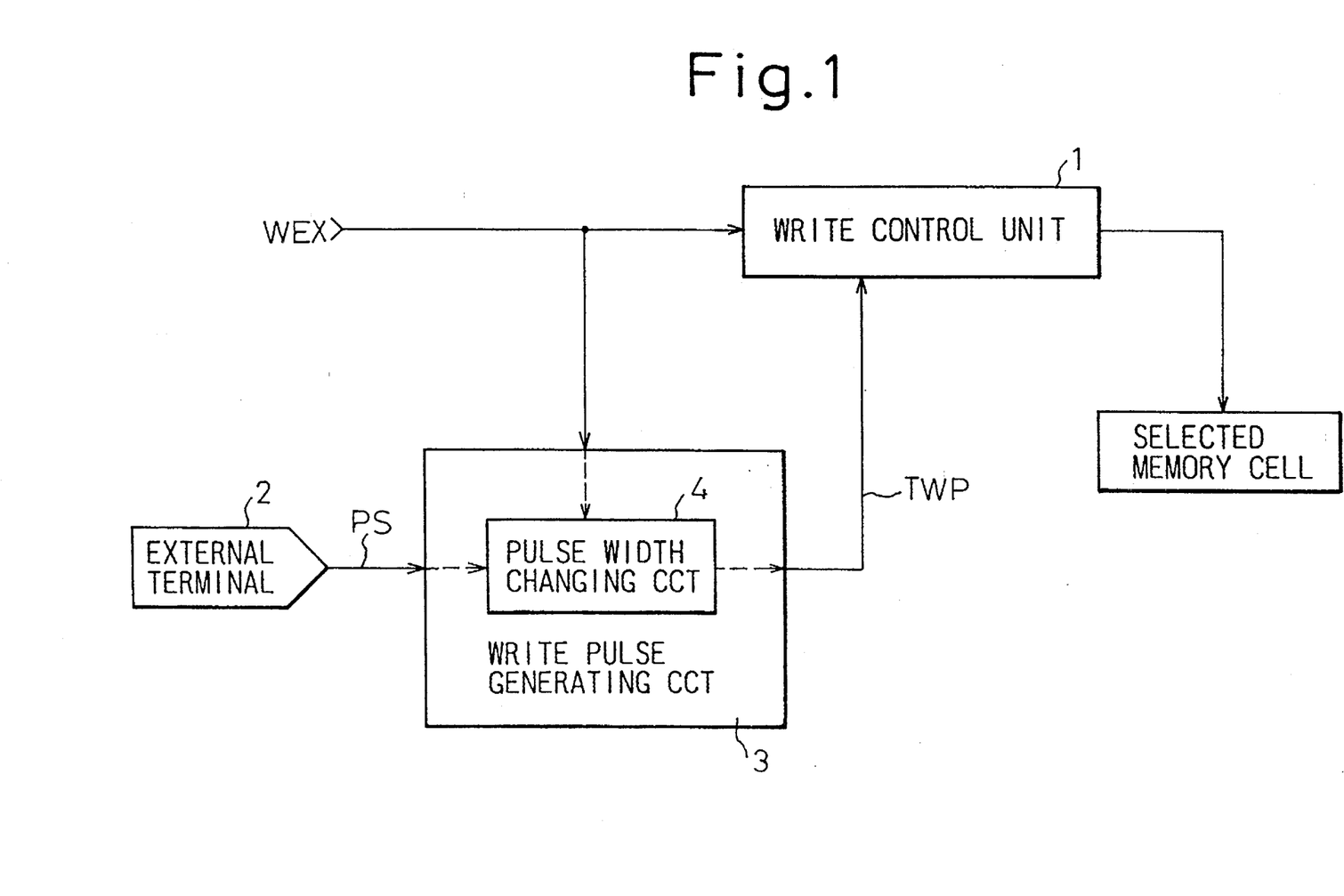
FIG. 1 is a block diagram showing the arrangement of a semiconductor memory device according to the present invention.

FIG. 1 shows the an arrangement of a semiconductor memory device according to the present invention.

In the drawing, reference numeral 1 denotes a write control unit for controlling data write to a selected memory cell on the basis of a write control signal WEX, 2 denotes an external terminal for test, and 3 denotes a write pulse generating circuit for generating a write pulse TWP for test on the basis of a set signal PS given from the external terminal 2 and the write control signal WEX, and supplying the write pulse TWP to the write control unit 1. This write pulse generating circuit 3 includes a pulse width changing circuit 4 which can variably set the pulse width of the write pulse TWP for test on the basis of the set signal PS.

According to the circuit arrangement shown in FIG. 1, the pulse width changing circuit 4 provided in the write pulse generating circuit 3 functions so as to variably set the pulse width of the write pulse TWP for test on the basis of the set signal PS given from the external terminal 2 at the time of test. In other words, this circuit can variably set the pulse width software-wise in accordance with the form of the set signal PS from the external-terminal 2 for test.

Accordingly, even after the fabrication of the present device, the pulse width of the write pulse TWP for test can be freely changed and set precisely. Moreover, the number of external terminals for exclusive use in testing can be reduced to minimum.

The pulse width itself that can be outputted by the present device is determined by the performance of the present device irrespective of performance of the testing device. Therefore, the write pulse width for test which meets with the real capacity of a high speed device such as GaAs or ECL can be obtained even when a relatively economical, low-speed testing device is used.

Figure 2:
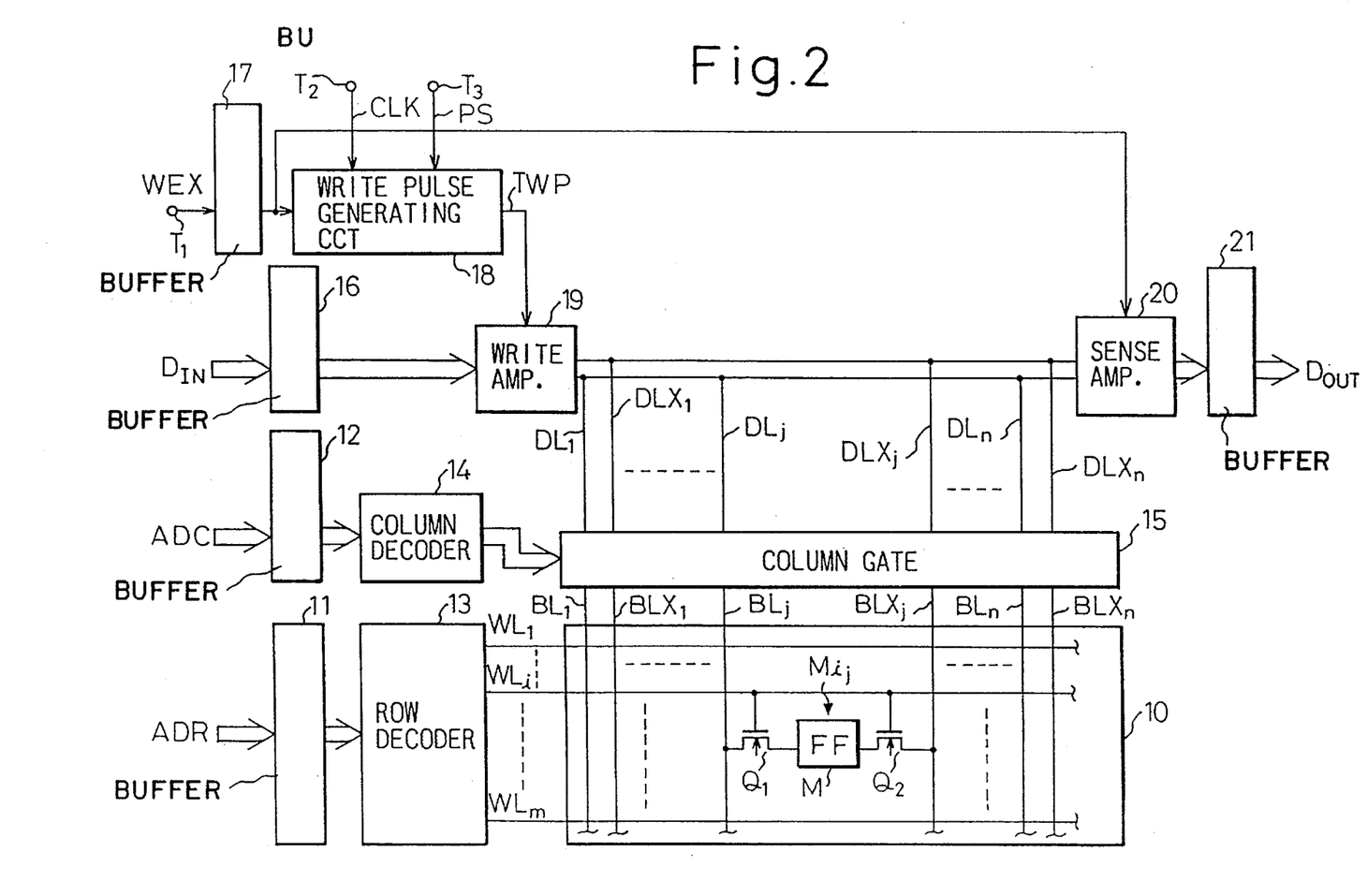
FIG. 2 is a block diagram showing the overall constitution of an SRAM according to one embodiment of the present invention.
Figure 3:
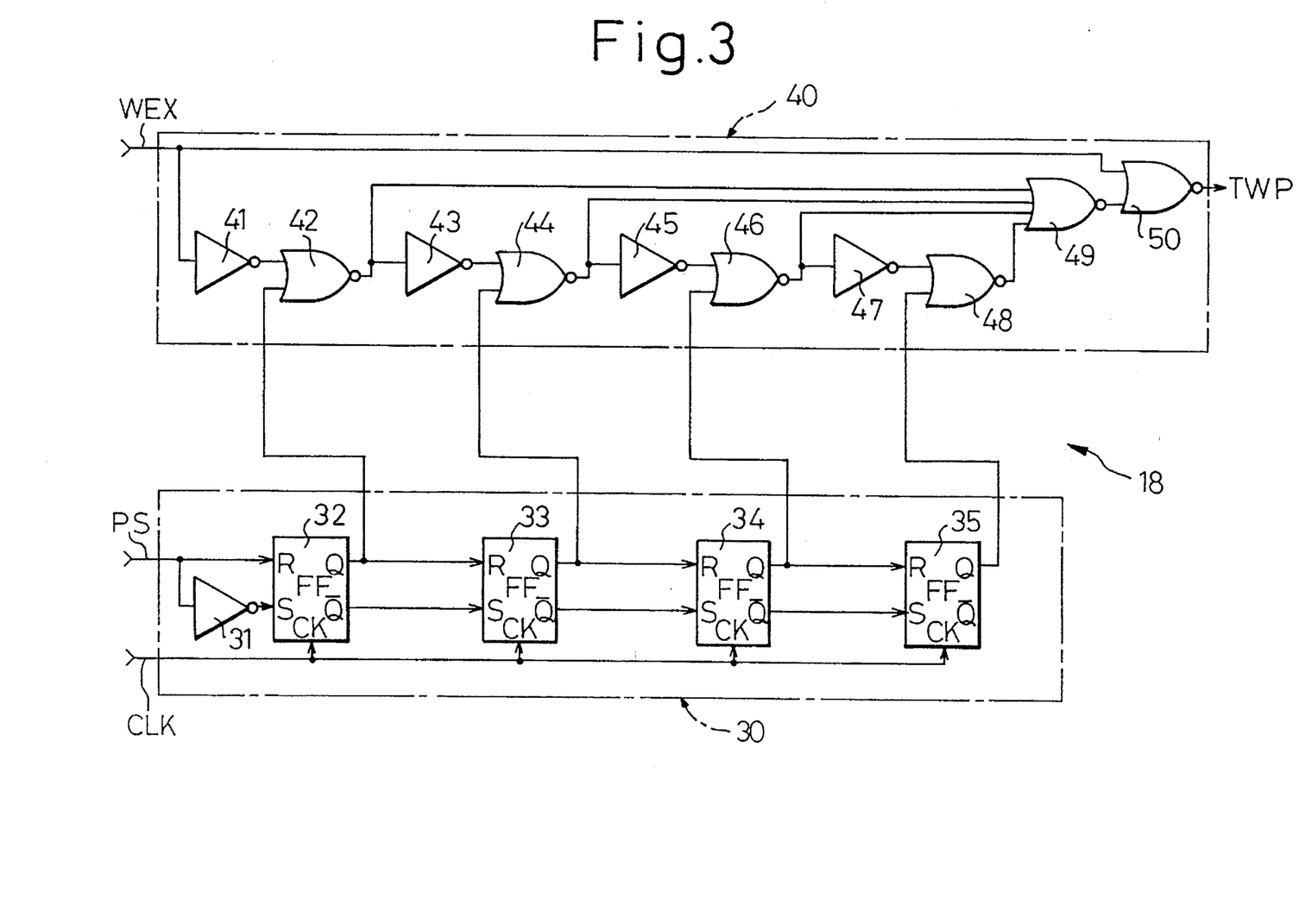
FIG. 3 is a circuit diagram showing one structural example of a write pulse generating circuit shown in FIG. 2.
Figure 4A:
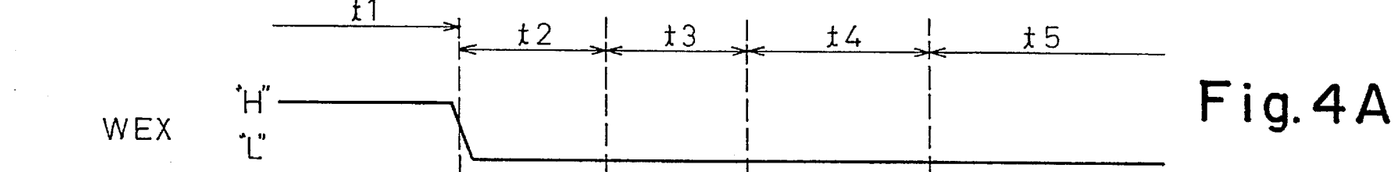
FIG. 4 is an operation timing chart of the circuit shown in FIG. 3.
Figure 4B:
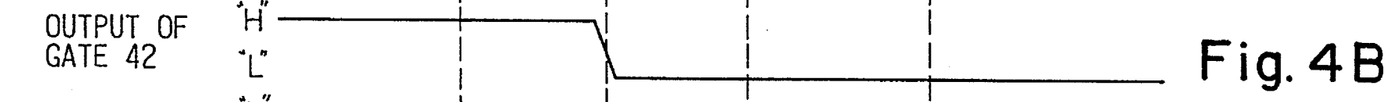
Figure 4C:
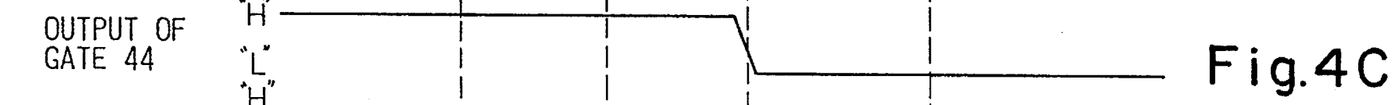
Figures 4D, 4E:
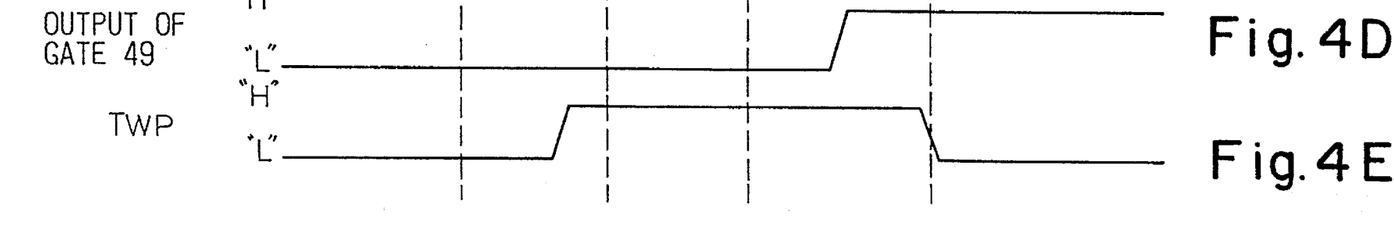

FIG. 2 shows the overall arrangement of an SRAM (static random access memory) according to one embodiment of the present invention, and FIG. 3 shows a structural example of the write pulse generating circuit in FIG. 2.

Referring initially to FIG. 2, reference numeral 10 denotes an SRAM cell array which comprises a plurality of static memory cells $M_{ij}$ that are disposed in matrix at the points of intersection between a plurality of word lines $WL_1$ to $WL_m$ and a plurality of complementary bit line pairs $BL_1$, $BLX_1$ to $BL_n$, $BLX_n$. In the example shown in the drawing, each memory cell $M_{ij}$ includes a flip-flop M as an information memory device and a pair of transfer gate transistors $Q_1$, $Q_2$ that are interposed between a pair of input/output nodes of this memory device M and each bit line $BL_j$, $BLX_j$.

Reference numeral 11 denotes a row address buffer for buffering a row address signal ADR from outside the chip; 12 denotes a column address buffer for buffering a column address signal ADC from outside the chip; 13 denotes a row decoder for decoding the row address signal ADR and selecting any one of a plurality of word lines $WL_1$ to $WL_m$; 14 denotes a column decoder for decoding the column address signal ADC and selecting any one of a plurality of bit line pairs $BL_1$, $BLX_1$ to $BL_n$, $BLX_n$; 15 denotes a column gate for connecting the selected bit line pair to the corresponding column line pair $DL_1$, $DLX_1$ to $DL_n$, $DLX_n$; 16 denotes a data input buffer for buffering an input data $D_{IN}$ given from outside; and 17 denotes a WE buffer for buffering a write enable signal (write control signal) WEX of an active row given from the write control terminal $T_1$.

Reference numeral 18 denotes the write pulse generating circuit which is the subject of the present invention. This circuit generates the write pulse TWP for test in response to the clock signal CLK given from the external terminal $T_2$, the set signal PS given from the external terminal $T_3$ for test and the write enable signal WEX inputted through the WE buffer 17.

Reference numeral 19 denotes a write amplifier which is activated by the write pulse TWP supplied from the write pulse generating circuit 18 and amplifies input data $D_{IN}$ inputted through the data input buffer 16; 20 denotes a sense amplifier which is activated in response to an "H" level (that is, during a read mode) of the write enable signal WEX inputted through the WE buffer 17, and senses and amplifies the data read out to the corresponding bit line from the selected memory cell and the data line pair through the column gate 15; and 21 denotes a data output buffer for buffering the output data of the sense amplifier 20 and outputting it to outside as the output data $D_{OUT}$.

Next, referring to FIG. 3, the write pulse generating circuit 18 comprises a shift register 30 having a four-bit structure and a delay circuit 40 formed by connecting a plurality of gates in multiple stages.

The shift register 30 includes an inverter 31 which responds to the set signal PS, an RS flip-flop 32 which inputs the set signal PS at a reset (R) terminal thereof and the output of the inverter 31 at the set (S) terminal thereof, an RS flip-flop 33 which inputs the Q output of the flip-flop 32 and an inversion output of the Q output at the R and S terminals thereof, an RS flip-flop 34 which inputs the Q output of the flip-flop 33 and its inversion output to the R and S terminals thereof, and an RS flip-flop 35 which inputs the Q output of the flip-flop 34 and its inversion output at the R and S terminals thereof. The clock signal CLK is inputted to the clock input terminal CK of each of these flip-flops 32 to 35.

On the other hand, the delay circuit 40 includes an inverter 41 which responds to the write enable signal WEX, a NOR gate 42 which responds to the output of this inverter and the Q output of the flip-flop 32, an inverter 43 which responds to the output of this NOR gate, a NOR gate 44 which responds to the output of this inverter and the Q output of the flip-flop 33, an inverter 45 which responds to the output of this NOR gate 44, a NOR gate 46 which responds to the output of this inverter and the Q output of the flip-flop 34, an inverter 47 which responds to the output of this NOR gate, a NOR gate 48 which responds to the output of this inverter and the Q output of the flip-flop 35, a NOR gate 49 which responds to the output of each of the NOR gates 42, 44, 46 and 48, and a NOR gate 50 which responds to the output of this NOR gate and the write enable signal WEX. The output of this NOR gate 50, that is, the write pulse TWP for tests, is supplied to the write amplifier 19 (see FIG. 2).

Hereinafter, the operation of the write pulse generating circuit will be explained with reference to the operation timing chart shown in FIG. 4.

Period t1

First, the flip-flop 34 of the third stage among the flip-flops 32 to 35 having the four-stage structure and forming the shift register 30 is set to the "H" level by using the set signal PS for changing the pulse width of the write pulse TWP and the clock signal CLK, while all the other flip-flops are set to the "L" level. As will be understood from the following explanation, however, the flip-flop 35 at the final stage may be set to the "H" or "L" level.

When level setting is made in this way, the output of each NOR gate 46, 48 in the delay circuit 40 is fixed to the "L" level irrespective of the level of the write enable signal WEX. Since the "L" level signals are applied from the flip-flop 32, 33 of the shift register 30 to the NOR gates 42, 44, the output of each NOR gate 42, 44 is determined depending on the level of the write enable signal WEX.

As shown in FIG. 4, the write enable signal WEX is at the "H" level (in the read mode) at the initial state (period t1). Therefore, the outputs of both NOR gates 42, 44 are at the "H" level. Accordingly, the output of the NOR gate 49 is at the "L" level and the output of the NOR gate 50 of the final stage is at the "L" level because the write enable signal WEX is at the "H" level.

Period t2

Under the state described above, the write enable signal WEX is switched to the "L" level (to the write mode). Consequently, the two inputs of the NOR gate 50 of the final stage change to the "L" level and hence, the output thereof changes to the "H" level.

Period t3

In response to the switching of the write enable signal WEX to the "L" level, the input of the NOR gate 42 is delayed by the delay quantity of the inverter 41 and changes to the "H" level, so that the output of the NOR gate 42 changes to the "L" level.

In other words, the time from switch of the write enable signal WEX to the "L" level to switch of the output of the NOR gate 42 to the "L" level is determined by the delay time of the inverter.41 and the delay time of the NOR gate 42.

At this time, the output of the NOR gate 44 among the input of the NOR gate 49 remains at the "H" level. Accordingly, the output of the NOR gate 49 remains at the "L" level.

Period t4

Further, the output level of the inverter 43 changes to the "H" level and in response to this change, the output of the NOR gate 44 changes to the "L" level. At this point, the four inputs of the NOR gate 49 all change to the "L" level. Accordingly, the output of the NOR gate 49 changes to the "H" level.

Period t5

Since one of the inputs of the NOR gate 50 of the final stage (that is, the output of the NOR gate 49) changes to the "H" level, its output returns to its original "L" level.

In this way, the pulse width of the test write pulse TWP outputted from the NOR gate 50 of the final stage is determined by the delay time of each of the inverters 41, 43, the NOR gates 42, 44 and the NOR gate 49.

In the output operation of the test write pulse TWP explained above, the "H" level is set to the flip-flop 34 of the third stage of the shift register 30, and the output pulse width can be changed by suitably changing this "H" level setting to other flip-flops.

For example, when the "H" level is set to the flip-flop 35 of the final stage and the "L" level is set to all the other flip-flops, the test write pulse TWP having a longer pulse width as the sum of the delay time of the inverter 45 and the delay time of the NOR gate 46 can be outputted (expansion of the output pulse width).

When the "H" level is set to the flip-flop 33 of the second level and the "L" level is set to the other flip-flops, on the contrary (with the proviso that either the "H" or "L" level may be set to the flip-flops 34, 35), the test write pulse TWP having a shorter pulse width as the sum of the delay time of the inverter 43 and the delay time of the NOR gate 44 can be outputted (reduction of the output pulse width).

According to the arrangement of the SRAM of the embodiment described above, the programmable storage portion (shift register 30) is provided to the write pulse generating circuit 18, and desired data, that is, data corresponding to the desired write pulse width, is written by suitably inputting the set signal PS from the external terminal $T_3$ at the time of test of this SRAM. In other words, the write pulse width can be variably set software-wise in accordance with the application form of the set signal PS given from the testing external terminal $T_3$.

Accordingly, the pulse width of the test write pulse TWP can be freely changed and set precisely not only during production of the SRAM but also after its production. Moreover, the number of external terminals used for the test can be reduced to minimum (two, i.e. the external terminal $T_3$ for the set signal PS and the external terminal $T_2$ for the clock signal CLK, in this embodiment).

The pulse width itself that can be outputted by the present device is determined by performance of the present device irrespective of performance of the testing equipment. Therefore, even when relatively economical, low-speed testing equipment is used, a test write pulse TWP which meets with real capacity of a high speed device can be obtained.

By the way, each flip-flop 32 to 35 forming the shift register 30 is preferably designed so that all of them are set to the "L" level at the time of switching on the power supply to the SRAM. According to such an arrangement, the outputs of the flip-flops 32 to 35 immediately after switching on the power supply are at the "L" level, and the write pulse width when programming is not done (that is, when the set signal PS is not inputted from the external terminal $T_3$) is the smaller one of the maximum pulse width that the write pulse generating circuit 18 can be output and the pulse width of the write enable signal WEX that is inputted to the write control terminal $T_1$. Therefore, even when the write pulse generating circuit 18 is added to an ordinary SRAM, the function of the product remains unaltered.

Hereinafter, an example of the circuit constitution which sets each flip-flop constituting the shift register 30 to the "L" level at the time of switching on the power supply of the SRAM will be explained with reference to FIG. 5 to 8.

Figure 5:
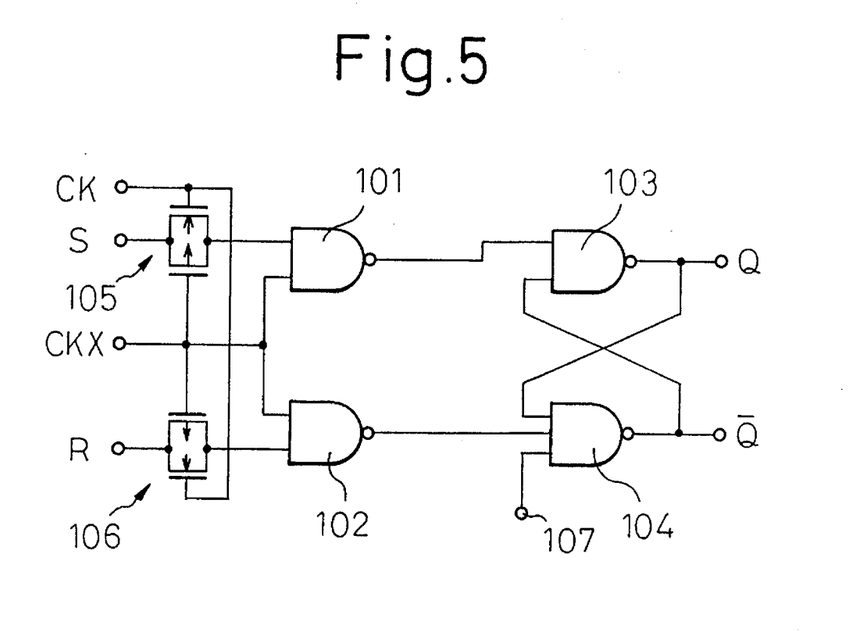
FIG. 5 is a circuit diagram showing the first structural example of each flip-flop shown in FIG. 3.

FIG. 5 shows the first structural example of each flip-flop.

In the drawing, reference numerals 101 to 104 denote the NAND gates which constitute each of the RS flip-flops 32 to 35 shown in FIG. 3. One of the input terminals of the NAND gate 101 is connected to the set (s) terminal and one of the input terminals of the NAND gate 102 is connected to the reset (R) terminal. The other input terminals of these NAND gates 101, 102 are connected to the input terminals CKX for the level inversion signal of the clock signal. The output terminal of the NAND gate 101 is connected to one of the input terminals of the NAND gate 103 while the output terminal of the NAND gate 102 is connected to one of the input terminals of the NAND gate 104. The output terminals of these NAND gates 103 and 104 are connected to the other input terminals of the NAND gates 104 and 103, respectively. Reference numerals 105 and 106 denote transmission gates, the S and R terminals of which are connected to the corresponding flip-flops 101 and 102, respectively. Each of the transmission gates 101 and 102 has a constitution wherein a p-channel transistor responding to the level inversion signal (CKX) of the clock signal and an n-channel transistor corresponding to the clock signal (CK) are connected in parallel.

Reference numeral 107 denotes the second reset (R) terminal, and the reset signal outputted from this terminal is inputted to the input terminal of the NAND gate 104.

The circuit constitution shown in FIG. 5 can reset each RS flip-flop 101 to 104 (that is, can set the Q output to the "L" level) by applying the signal to the second R terminal added to each RS flip-flop after the power supply is switched on.

Figure 6:
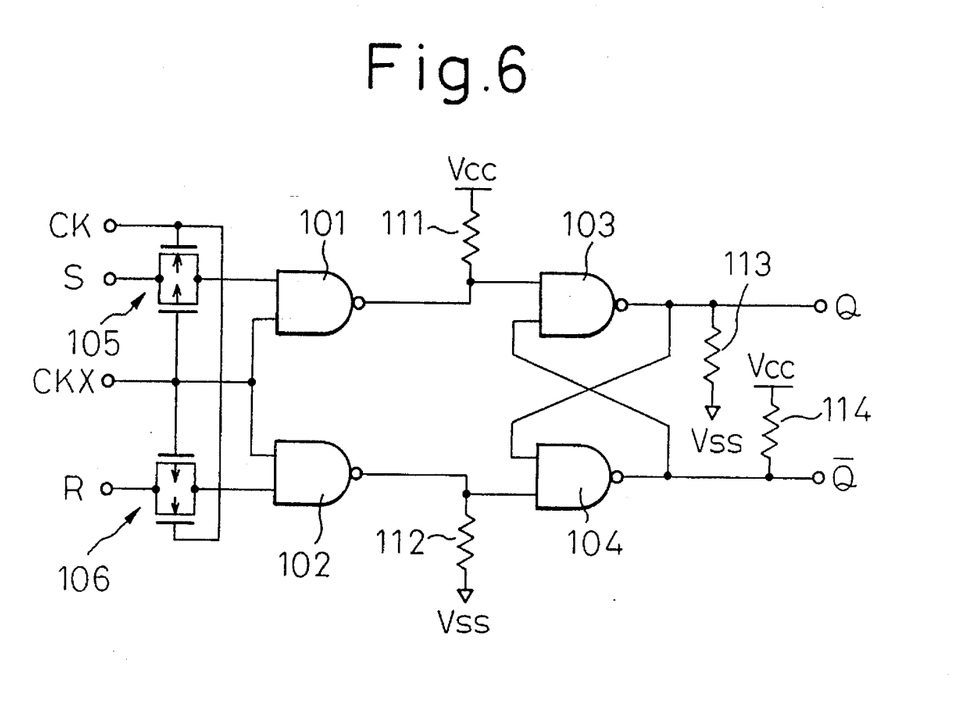
FIG. 6 is a circuit diagram showing the second structural example of each flip-flop shown in FIG. 3.

FIG. 6 shows the second structural example of each flip-flop.

The circuit constitution shown in the drawing is different from the first structural example shown in FIG. 5 in the following points:

① The circuit does not include the reset (R) terminal 107.

② Resistors 111, 114, each having a relatively high resistance, are interposed between the power supply line Vcc having a high potential and the output terminals of the NAND gates 101, 114, respectively.

③ Resistors 112, 113, each having a relatively high resistance, are interposed between the output terminals of the NAND gates 102, 103 and a power supply line Vss having a low potential. Since the other constitution and the functions are the same as those of the first structural example shown in FIG. 5, their explanation will be omitted.

When the resistors 111 to 114 are disposed, they are disposed between the output terminals of those NAND gates, which are desired to be initially set to the "H" level (or the "L" level) after making of the power supply, and the power supply line Vcc having the high potential (or the power supply line Vss having the low potential). In the example shown in the drawing, therefore, the output levels of the NAND gates 101, 104 are set to the "H" level after making of the power supply, while the output levels of the NAND gates 102, 103 are set to the "L" level.

As described above, the circuit constitution shown in FIG. 6 can reset the RS flip-flops (that is, can set the Q output to the "L" level) after the power supply is switched on.

Figure 7:
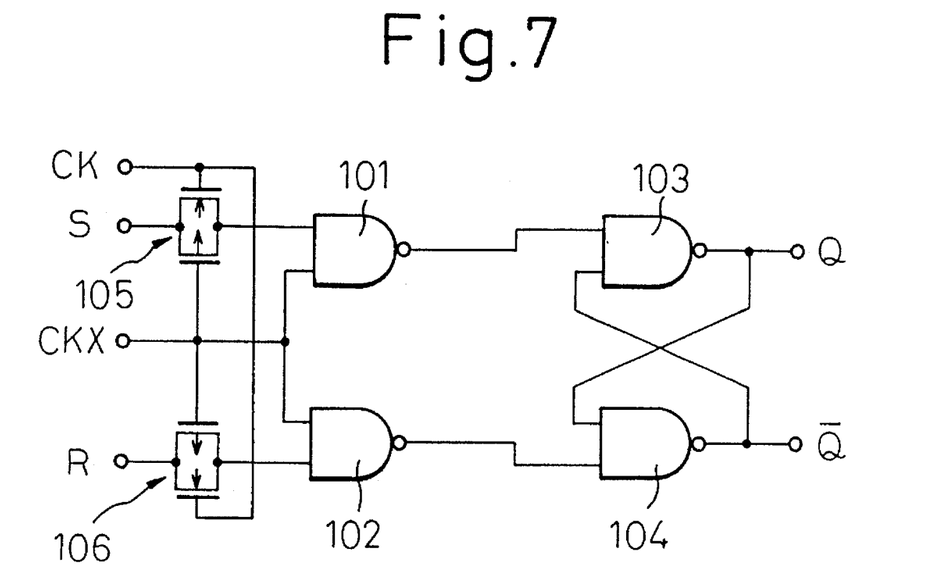
FIG. 7 is a circuit diagram showing the third structural example of each flip-flop shown in FIG. 3.

FIG. 7 shows the third structural example of each flip-flop.

In comparison with the first structural example shown in FIG. 5, the circuit constitution shown in the drawing apparently has the same structure with the exception that the circuit is not equipped with the reset (R) terminal 107. However, the threshold level of each NAND gate 101 to 104 is set to a predetermined value.

In other words, in the example shown in the drawing, the threshold level of each NAND gate 101, 104 is set to a higher level so as to output the "H" level, while the threshold level of each NAND gate 102, 103 is set to a lower level so as to output the "L" level.

Hereinafter, the method of setting or changing the threshold level of each NAND gate 101 to 104 will be explained with reference to FIG. 8.

Figure 8:
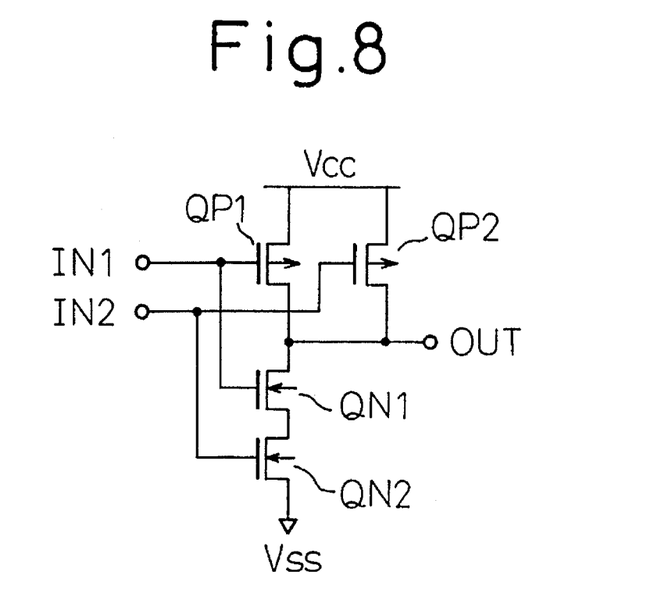
FIG. 8 is a circuit diagram showing a structural example of an NAND gate shown in FIG. 7.

FIG. 8 shows the circuit constitution of each NAND gate. Each NAND gate comprises CMOS gates (p-channel transistor QP1 and n-channel transistor QN1) which are connected between the power supply line Vcc having a high potential and the power supply line Vss having a low potential, and respond to one (IN1) of the inputs, respectively, and CMOS gates (p-channel transistor QP2 and n-channel transistor QN2) which are likewise connected between the power supply line Vcc and the power supply line Vss, and respond to the other (IN2) input, respectively. Incidentally, the output terminal of each CMOS gate is connected to the output terminal OUT of the NAND gate.

In such a constitution, assuming that the factor representing the driving capacity of each transistor is $\beta$ (which is proportional to the gate width (W) of the transistor and is inversely proportional to the gate length (L); $\beta \propto W/L$) and the ratio $\beta$ ($\beta_N$) of each n-channel transistor QN1, QN2 to $\beta$ ($\beta_p$) of each p-channel transistor QP1, QP2 is $\beta_R$, the threshold level of the input signal can be changed by appropriately adjusting this $\beta_R$ ($\beta_R = \beta_N/\beta_p$).

Generally, in the case of $\beta_R > 1$, the threshold level is set to be lower than ½ of the power supply voltage. Accordingly, the NAND gates can recognize the input signal as the "H" level and can output the "L" level. In the case of $\beta_R < 1$, on the other hand, the threshold level is higher than ½ of the power supply voltage. Accordingly, the NAND gates can recognize the input signal as the "L" level and can output the "H" level. Here, the values $\beta_p$, $\beta_N$ can be freely changed by appropriately adjusting the gate width (W) and the gate length (L) of the transistor.

As described above, in the circuit constitution shown in FIGS. 7 and 8, the threshold level of each NAND gate constituting the RS flip-flop is set in advance to the predetermined value. Therefore, the flip-flop can be reset (in other words, the Q output can be set to the "L" level) at the time the power supply is switched on.

Incidentally, it is possible to employ the circuit constitution wherein the circuit constitution shown in FIG. 6 is incorporated in the circuit constitution shown in FIG. 7, though it is not shown in the drawing.

In the embodiments given above, the number of flip-flops constituting the shift register 30 is four for the purpose of simplification, but it would be obvious for those skilled in the art that the adjustment range of the pulse width of the test write pulse TWP can be expanded by increasing the number of flip-flops disposed.

In this case, the pitch of the output pulse width that can be set is determined by the combination of the delay time of each device (inverter, NOR gate) used for the delay circuit 40. In the case of high speed devices such as GaAs, ECL, etc., the delay time of the devices is generally from 30 to 50 ps. Therefore, a pitch of the output pulse width of about 100 ps is possible.

What is claimed is:

1. A semiconductor memory device equipped with a write control system for controlling data write to a selected memory cell on the basis of a write control signal, comprising:

an external terminal for test; and a write-pulse generating circuit for generating a test write pulse on the basis of a set signal applied thereto from said external terminal and said write control signal, and supplying said test write pulse to said write control system;

said write pulse generating circuit including a pulse-width changing circuit for variably setting the pulse width of said test write pulse on the basis of said set signal, wherein said pulse-width changing circuit includes a delay circuit which comprises a plurality of gates each having a delay time and connected in multiple stages, and the gate of the initial stage of which responds to said write control signal, and a shift register having a multiple-bit structure wherein the output terminal of each bit is connected to the input terminals of specific gates of a plurality of said gates, and wherein a total delay time in said delay circuit is variably set to a quantity corresponding to a desired write pulse width by inputting said set signal to said shift register in a specific manner, wherein said shift register includes an inverter and a plurality of cascaded RS flip-flops in a number corresponding to the plurality of said bits, said flip-flop of the initial stage being reset by said set signal and set by the output of said inverter, and the output terminal of each of said flip-flops is connected to the corresponding input terminal of each of said specific gates.

2. The semiconductor memory device according to claim 1, wherein the output of each of said RS flip-flops forming said shift register is set in such a manner as to attain an "L" level at the time of switching on the power supply to said semiconductor memory device.

3. The semiconductor memory device according to claim 2, wherein each of said RS flip-flops includes a first NAND gate responsive to a set input and a clock signal, a second NAND gate responsive to a reset input and said clock signal, a third NAND gate responsive to the output of said first NAND gate and an inversion output of said flip-flop, and producing the output of said flip-flop, and a fourth NAND gate responsive to the outputs of said second and third NAND gates and a second reset input, and producing an inversion output of said flip-flop.

4. The semiconductor memory device according to claim 2, wherein each of said RS flip-flops includes a first NAND gate responsive to a set input and a clock signal, a second NAND gate responsive to a reset input and said clock signal, a third NAND gate responsive to the output of said first NAND gate and an inversion output of said flip-flop and producing the output of said flip-flop, a fourth NAND gate responsive to the outputs of said second and third NAND gates and producing an inversion output of said flip-flop, resistors interposed between the output terminals of said first and fourth NAND gates and a power supply line having a high potential, respectively, and resistors interposed between the output terminals of said second and third NAND gates and a power supply line having a low potential, respectively.

5. The semiconductor memory device according to claim 2, wherein each of said RS flip-flops includes a first NAND gate responsive to a set input and a clock signal, a second NAND gate responsive to a reset input and said clock signal, a third NAND gate responsive to the output of said first NAND gate and an inversion output of said flip-flop, and producing the output of said flip-flop, and a fourth NAND gate responsive to the outputs of said second and third NAND gates, and producing an inverted output of said flip-flop, the threshold level of each of said first and fourth NAND gates is set to a high level so that an "H" level can be outputted at the time of switching on the power supply, and the threshold level of each of said second and third NAND gates is set to a low level so that an "L" level can be outputted at the time of switching on the power supply.

* * * * *